(12) United States Patent
Shen

(10) Patent No.: US 6,368,894 B1
(45) Date of Patent: Apr. 9, 2002

(54) MULTI-CHIP SEMICONDUCTOR MODULE AND MANUFACTURING PROCESS THEREOF

(76) Inventor: Ming-Tung Shen, 4F, No. 52, Sec. 2, Chung-Shan N. Rd., Taipei City (TW)

( * ) Notice: Subject to any disclaimer, the term of this patent is extended or adjusted under 35 U.S.C. 154(b) by 0 days.

(21) Appl. No.: 09/604,390

(22) Filed: Jun. 27, 2000

(30) Foreign Application Priority Data

Sep. 8, 1999 (TW) ........................................ 88115461 A
Sep. 8, 1999 (TW) ........................................ 88215325 U

(51) Int. Cl.$^7$ ..................... H01L 21/44; H01L 21/48; H01L 21/50
(52) U.S. Cl. ................. 438/106; 438/108; 438/109; 438/113; 438/123; 438/127
(58) Field of Search ....................... 438/106, 10, 15, 438/108, 455, 612, 660, 17, 127, 110, 112, 118, 115, 123, 109, 113, 126

(56) References Cited

U.S. PATENT DOCUMENTS

| | | | |
|---|---|---|---|
| 5,583,378 A | * 12/1996 | Marrs et al. | 257/710 |
| 5,646,828 A | * 7/1997 | Degani et al. | 257/707 |
| 6,104,091 A | * 8/2000 | Ito et al. | 257/738 |
| 6,118,178 A | * 9/2000 | Takeuchi | 257/707 |

* cited by examiner

Primary Examiner—Matthew Smith
Assistant Examiner—Igwe U. Anya
(74) Attorney, Agent, or Firm—Merchant & Gould P.C.

(57) ABSTRACT

A process of manufacturing a multi-chip semiconductor module includes: providing a substrate having opposite first and second surfaces, a plurality of conductive vias that extend through the first and second surfaces, a circuit layout patterned on the first surface of the substrate and connected electrically to the conductive vias, and a chip-receiving opening formed therein; mounting a contact pad surface of a first semiconductor chip on the first surface of the substrate such that the first semiconductor chip has a first set of contact pads registered with the chip-receiving opening, and a second set of contact pads around the chip-receiving opening, and connecting electrically the second set of contact pads of the first semiconductor chip to the circuit layout; disposing an adhesive layer having opposite first and second adhesive surfaces and a plurality of windows that extend through the first and second adhesive surfaces inside the chip-receiving opening, and adhering the second adhesive surface of the adhesive layer to the contact pad surface of the first semiconductor chip such that the windows are registered with the first set of contact pads of the first semiconductor chip; placing a conductive body in each of the windows; and disposing a second semiconductor chip in the chip-receiving opening, and attaching a contact pad surface of the second semiconductor chip to the first adhesive surface of the adhesive layer so that a plurality of contact pads on the contact pad surface of the second semiconductor chip are connected electrically and respectively with the conductive bodies in the windows to establish electrical connection with the first semiconductor chip.

26 Claims, 8 Drawing Sheets

MULTI-CHIP SEMICONDUCTOR MODULE AND MANUFACTURING PROCESS THEREOF

BACKGROUND OF THE INVENTION

1. Field of the Invention

The present invention relates to a multi-chip semiconductor module and a manufacturing process thereof. More particularly, the present invention relates to a multi-chip semiconductor module manufacturing process for increasing the yield of the multi-chip semiconductor module, and a multi-chip semiconductor module that incorporates different functional chips.

2. Description of the Prior Art

Portability is a main development trend in the semiconductor industry. In order to reduce the overall size and weight of an electronic product, the size of a printed circuit board has to be reduced first. It has been proposed to combine semiconductor chips with different functions into a single semiconductor module, that is, the multi-chip semiconductor module.

However, poor yield of the multi-chip semiconductor module has always been a problem during mass production. When one of the semiconductor chips in the module is defective, the whole module will be affected.

Accordingly, the present invention is directed to a multi-chip semiconductor module manufacturing process for increasing the yield of the multi-chip semiconductor module, and a multi-chip semiconductor module that incorporates semiconductor chips with different functions.

SUMMARY OF THE INVENTION

In one aspect of the present invention, a process of manufacturing a multi-chip semiconductor module comprises the steps of: (a) providing a substrate having opposite first and second surfaces, a plurality of conductive vias that extend through the first and second surfaces, a circuit layout patterned on the first surface of the substrate and connected electrically to the conductive vias, and a chip-receiving opening formed therein; (b) mounting a contact pad surface of a first semiconductor chip on the first surface of the substrate such that the first semiconductor chip has a first set of contact pads registered with the chip-receiving opening, and a second set of contact pads around the chip-receiving opening, and connecting electrically the second set of contact pads of the first semiconductor chip to the circuit layout; (c) disposing an adhesive layer having opposite first and second adhesive surfaces and a plurality of windows that extend through the first and second adhesive surfaces inside the chip-receiving opening, and adhering the second adhesive surface of the adhesive layer to the contact pad surface of the first semiconductor chip such that the windows are registered with the first set of contact pads of the first semiconductor chip; (d) placing a conductive body in each of the windows; and (e) disposing a second semiconductor chip in the chip-receiving opening, and attaching a contact pad surface of the second semiconductor chip to the first adhesive surface of the adhesive layer so that a plurality of contact pads on the contact pad surface of the second semiconductor chip are connected electrically and respectively with the conductive bodies in the windows to establish electrical connection with the first semiconductor chip.

In another aspect of the present invention, a process of manufacturing a multi-chip semiconductor module comprises the steps of: (a) providing a substrate having opposite first and second surfaces, a plurality of conductive vias that extend through the first and second surfaces, first and second circuit layouts patterned respectively on the first and second surfaces of the substrate and connected electrically to the conductive vias, and a chip-receiving opening formed therein; (b) mounting a contact pad surface of a first semiconductor chip on the first surface of the substrate such that the first semiconductor chip has a first set of contact pads registered with the chip-receiving opening, and a second set of contact pads around the chip-receiving opening, and connecting electrically the second set of contact pads of the first semiconductor chip to the first circuit layout; (c) disposing a second semiconductor chip in the chip-receiving opening, mounting a contact pad surface of the second semiconductor chip to the contact pad surface of the first semiconductor chip, and connecting electrically a plurality of contact pads on the contact pad surface of the second semiconductor chip with the first set of contact pads of the first semiconductor chip; and (d) mounting a contact pad surface of a third semiconductor chip on the second surface of the substrate, and connecting electrically a plurality of contact pads on the contact pad surface of the third semiconductor chip to the second circuit layout.

In still another aspect of the present invention, a multi-chip semiconductor comprises: a substrate having opposite first and second surfaces, a plurality of conductive vias that extend through the first and second surfaces, a circuit layout patterned on the first surface of the substrate and connected electrically to the conductive vias, and a chip-receiving opening formed therein; a first semiconductor chip having a contact pad surface on which first and second sets of contact pads are disposed; a first adhesive layer having a first adhesive surface adhered to the first surface of the substrate and a second adhesive surface adhered to the contact pad surface of the first semiconductor chip such that the first set of contact pads is registered with the chip-receiving opening, and such that the second set of contact pads is disposed around the chip-receiving opening, the first adhesive layer being formed with a plurality of windows that extend through the first and second adhesive surfaces and that are registered with the second set of contact pads; a plurality of conductive bodies disposed respectively in the windows of the first adhesive layer and connecting electrically the second set of contact pads and the circuit layout; a second adhesive layer disposed inside the chip-receiving opening and having opposite first and second adhesive surfaces and a plurality of windows that extend through the first and second adhesive surfaces of the second adhesive layer, the second adhesive surface of the second adhesive layer being adhered to the contact pad surface of the first semiconductor chip such that the windows of the second adhesive layer are registered with the first set of contact pads of the first semiconductor chip; a plurality of conductive bodies disposed respectively in the windows of the second adhesive layer and connected electrically to the first set of contact pads; and a second semiconductor chip disposed in the chip-receiving opening and having a contact pad surface attached to the first adhesive surface of the second adhesive layer, the contact pad surface of the second semiconductor chip having a plurality of contact pads that are connected electrically and respectively with the conductive bodies in the windows of the second adhesive layer to establish electrical connection with the first semiconductor chip.

In yet another aspect of the present invention, a multi-chip semiconductor module comprises: a substrate having opposite first and second surfaces, a plurality of conductive vias that extend through the first and second surfaces, first and second circuit layouts patterned respectively on the first and second surfaces of the substrate and connected electrically to the conductive vias, and a chip-receiving opening formed therein; a first semiconductor chip having a contact pad surface on which first and second sets of contact pads are disposed, the contact pad surface of the first semiconductor chip being mounted on the first surface of the substrate such that the first set of contact pads are registered with the chip-receiving opening, and such that the second set of contact pads are disposed around the chip-receiving opening and are connected electrically to the first circuit layout; a second semiconductor chip disposed in the chip-receiving opening, and having a contact pad surface on which a plurality of contact pads are disposed, the contact pad surface of the second semiconductor chip being mounted to the contact pad surface of the first semiconductor chip such that the contact pads of the second semiconductor chip are connected electrically to the first set of contact pads of the first semiconductor chip; and a third semiconductor chip having a contact pad surface on which a plurality of contact pads are disposed, the contact pad surface of the third semiconductor chip being mounted on the second surface of the substrate such that the contact pads of the third semiconductor chip are connected electrically to the second circuit layout.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the present invention, and are incorporated in and constitute a part of this specification. The drawings illustrate preferred embodiments of the present invention and, together with the description, serve to explain the principles of the present invention. In the drawings.

DESCRIPTION OF THE PREFERRED EMBODIMENTS

Figure 1:
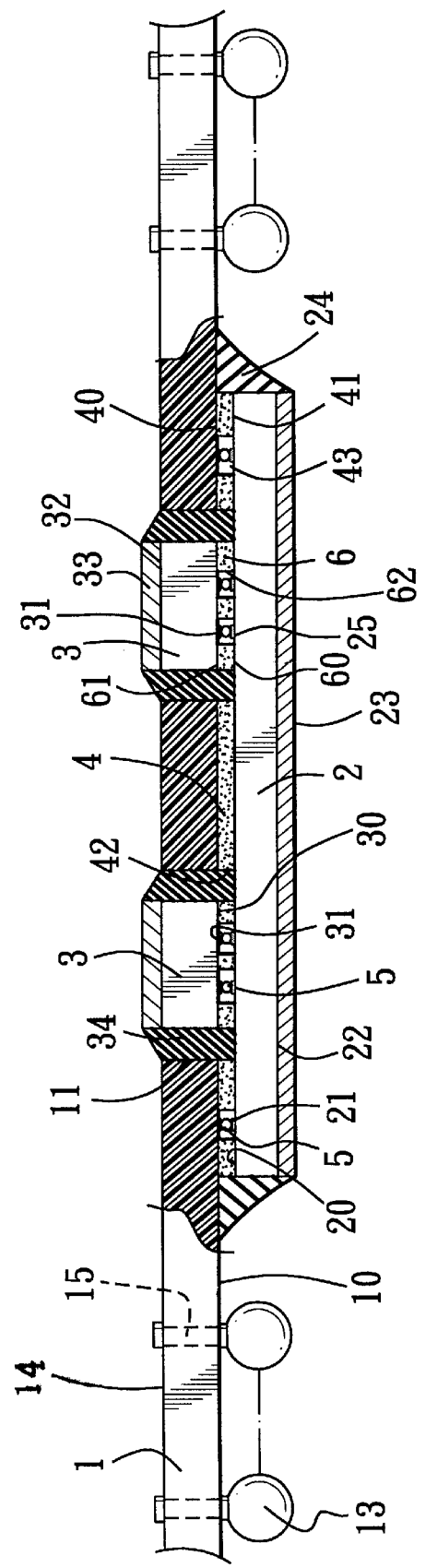
FIG. 1 is a schematic partly cross-sectional view of a multi-chip semiconductor module in accordance with a first preferred embodiment of the present invention.
Figure 2:
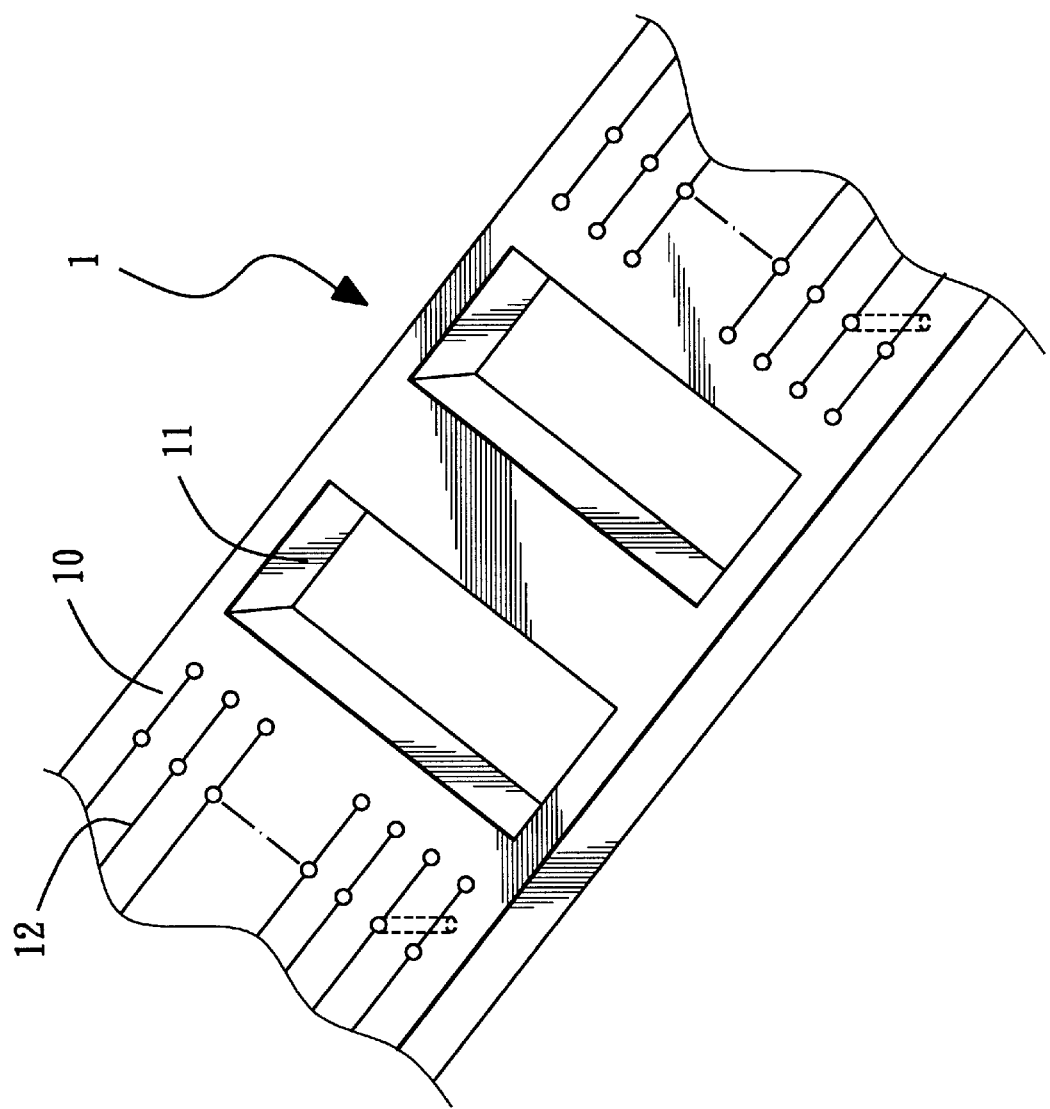
FIG. 2 is a fragmentary perspective view showing a substrate of the first preferred embodiment.

FIG. 1 is a schematic partly cross-sectional view showing a multi-chip semiconductor module in accordance with a first preferred embodiment of the present invention. Substrate 1, which can be a printed circuit board, a metal plate covered with an insulating material, or a ceramic board, has a first surface 10 and a second surface 14 opposite to the first surface 10, and is formed with at least one chip-receiving opening 11 therein. In this preferred embodiment, two chip-receiving openings 11 are formed in the substrate 1. A plurality of conductive vias 15 extend through the first and second surfaces 10, 14 of the substrate 1. A circuit layout 12, as shown in FIG. 2, is patterned on the first surface 10 of the substrate 1 and is connected electrically to the conductive vias 15. A plurality of solder balls 13 are mounted on the first surface 10 of the substrate 1 at positions corresponding to the conductive vias 15, and are connected electrically and respectively to the conductive vias 15.

Figure 4:
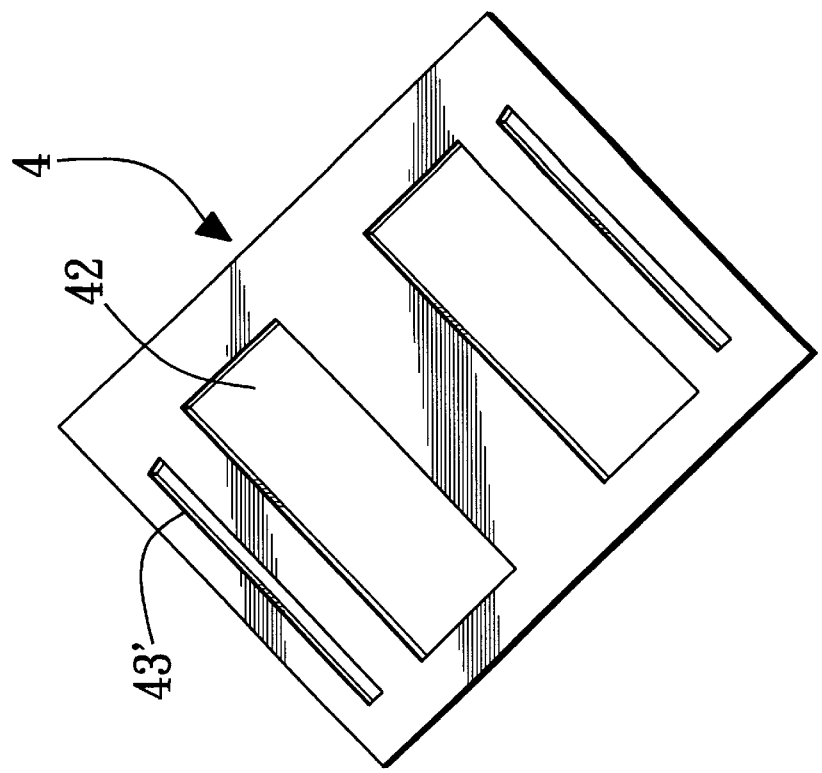
FIG. 4 is a perspective view showing a modified adhesive layer of the first preferred embodiment.
Figure 3:
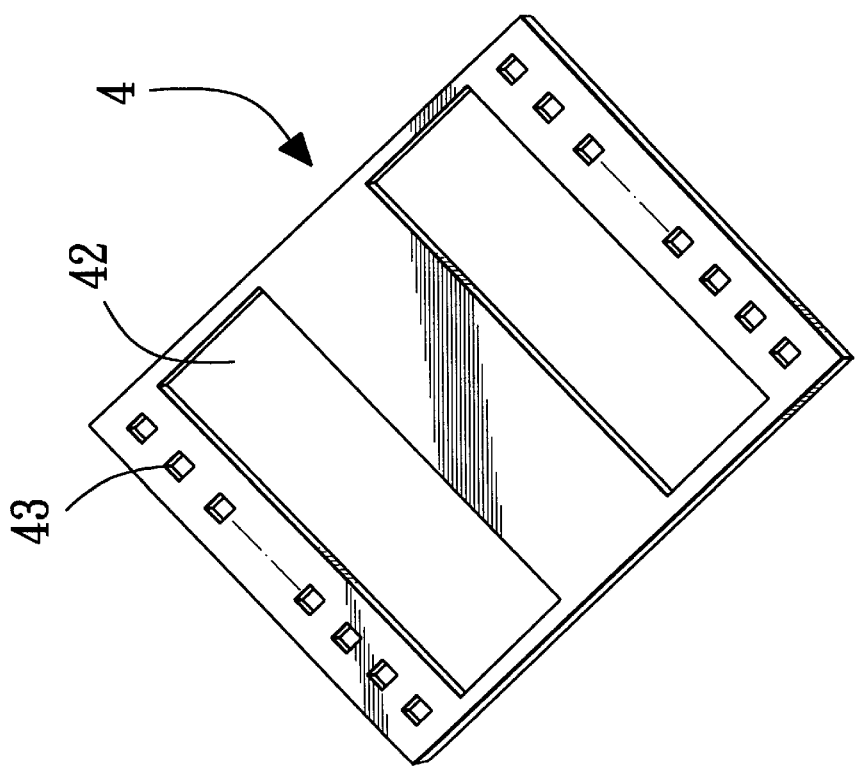
FIG. 3 is a perspective view showing an adhesive layer of the first preferred embodiment.
Figure 5:
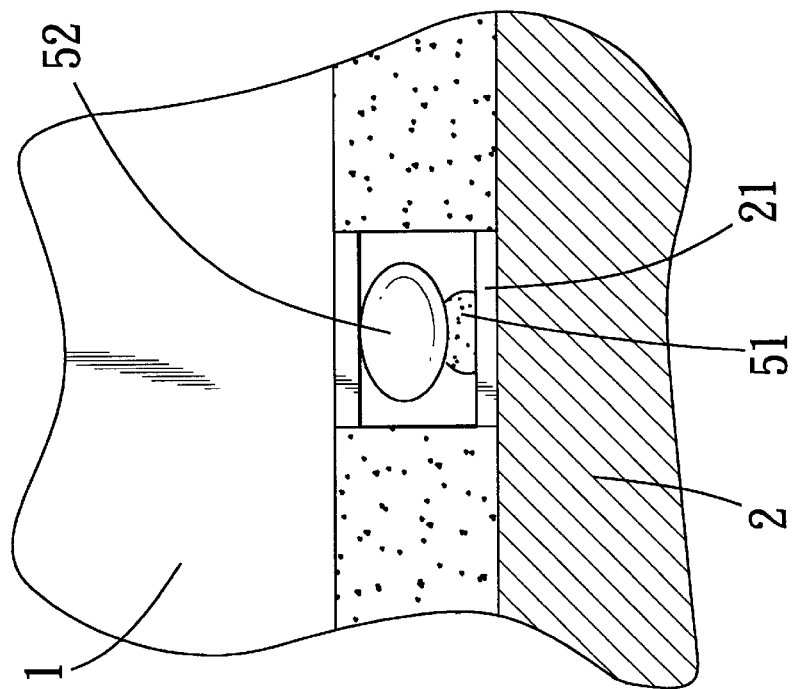
FIG. 5 is a fragmentary partly cross-sectional view showing a conductive body of the first preferred embodiment.

A first semiconductor chip 2 has a contact pad surface 20 on which first and second sets of contact pads 25, 21 are disposed, and a side 22 opposite to the contact pad surface 20. A first adhesive layer 4 has a first adhesive surface 40 adhered to the first surface 10 of the substrate 1, and a second surface 41 adhered to the contact pad surface 20 of the first semiconductor chip 2, such that the first set of contact pads 25 is registered with the corresponding chip-receiving opening 11 via a through-hole 42 in the first adhesive layer 4 that is aligned with the corresponding chip-receiving opening 11, and such that the second set of contact pads 21 is disposed around the corresponding chip-receiving opening 11. As shown in FIG. 3, the first adhesive layer 4 is formed with a plurality of windows 43 that extend through the first and second adhesive surfaces 40, 41 and that are registered with the second set of contact pads 21. Alternatively, the windows 43 of the first adhesive layer 4 along a longitudinal axis can be replaced by an elongate slot 43', as shown in FIG. 4. A plurality of conductive bodies 5 are disposed respectively in the windows 43 and connect electrically the second set of contact pads 21 and the circuit layout 12 on the first surface 10 of the substrate 1. Each of the conductive bodies 5, in the present embodiment, may be a conductive adhesive doped with a metal material (such as silver, gold, copper and the like), a solder ball, a solder paste and a solder ball, a conductive silver adhesive and a conductive metal ball, or a solder paste and a conductive metal ball. As shown in FIG. 5, a solder ball or a metal ball 52 is formed on the contact pad 21 of the first semiconductor chip 2, while a conductive adhesive or solder paste 51 is formed on the first surface 10 of the substrate 1 and is connected electrically to the circuit layout 12. The solder ball or metal ball 52 and the conductive adhesive or solder paste 51 are then welded to each other.

Figure 6:
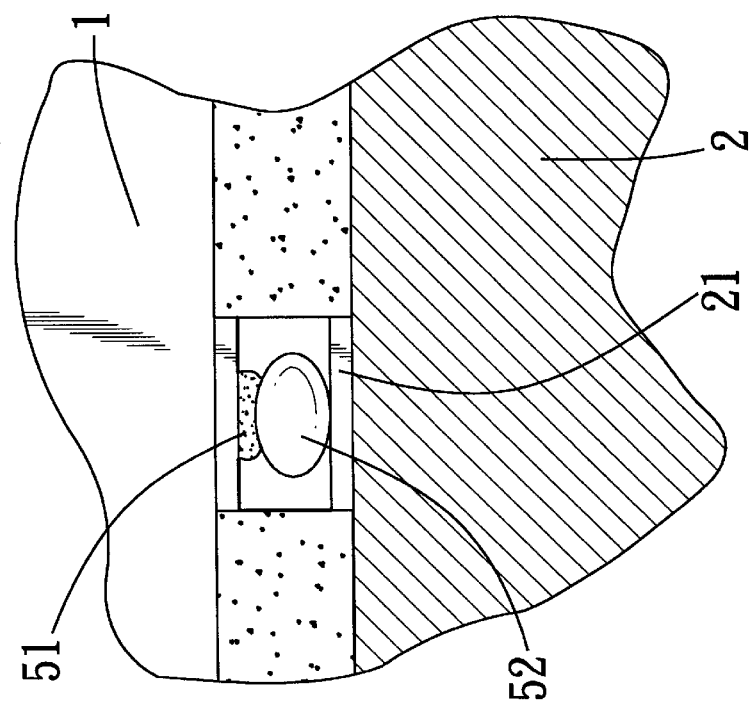
FIG. 6 is a fragmentary partly cross-sectional view showing another conductive body of the first preferred embodiment.

As shown in FIG. 6, unlike the conductive body 5 of FIG. 5, the solder ball or metal ball 52 is formed on the first surface 10 of the substrate 1 and is connected electrically to the circuit layout 12, while the conductive adhesive or solder paste 51 is formed on the contact pad 21 of the first semiconductor chip 2.

Referring again to FIG. 1, in order to protect the first semiconductor chip 2 and enhance the heat dissipating performance, a metal heat dissipating plate 23 is mounted on the side 22 of the first semiconductor chip 2 opposite to the contact pad surface 20 thereof. To further protect the first semiconductor chip 2, an encapsulation layer 24 is formed around the first semiconductor chip 2. The encapsulation layer 24 can be made of, for example, an epoxy resin.

Figure 7:
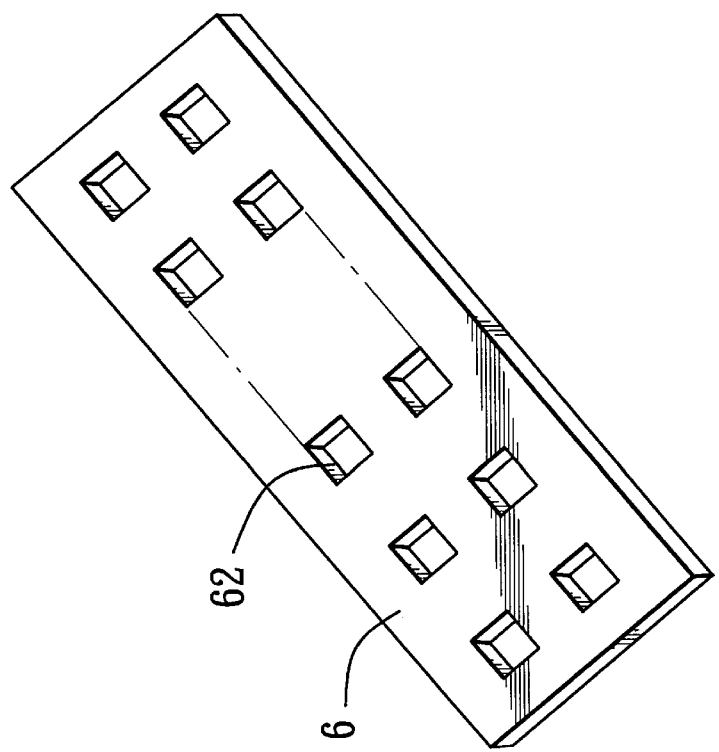
FIG. 7 is a perspective view showing another adhesive layer of the first preferred embodiment.

In each of the chip-receiving openings 11 of the substrate 1, there is disposed a second semiconductor chip 3. Each of the second semiconductor chips 3 has a contact pad surface 30 with a plurality of contact pads 31, and a side 32 opposite to the contact pad surface 30. A second adhesive layer 6 is disposed inside a respective one of the chip-receiving openings 11 of the substrate 1. The second adhesive layer 6 has a first adhesive surface 61 adhered to the respective second semiconductor chip 3, and a second adhesive surface 60 which is opposite to the first adhesive surface 61 and which is adhered to the first semiconductor chip 2. As shown in FIG. 7, the second adhesive layer 6 has a plurality of windows 62 which extend through the first and second adhesive surfaces 61,60 thereof and which are registered with the first set of contact pads 25 of the first semiconductor chip 2 and the contact pads 31 of the respective second semiconductor chip 3. A plurality of conductive bodies 5 are disposed respectively in the windows 62 of the second adhesive layer 6. Each of the conductive bodies 5 is connected electrically to the corresponding contact pad 21 of the first semiconductor chip 2 and the corresponding contact pad 31 of the second semiconductor chip 3 so as to establish electrical connection therebetween.

Figure 8:
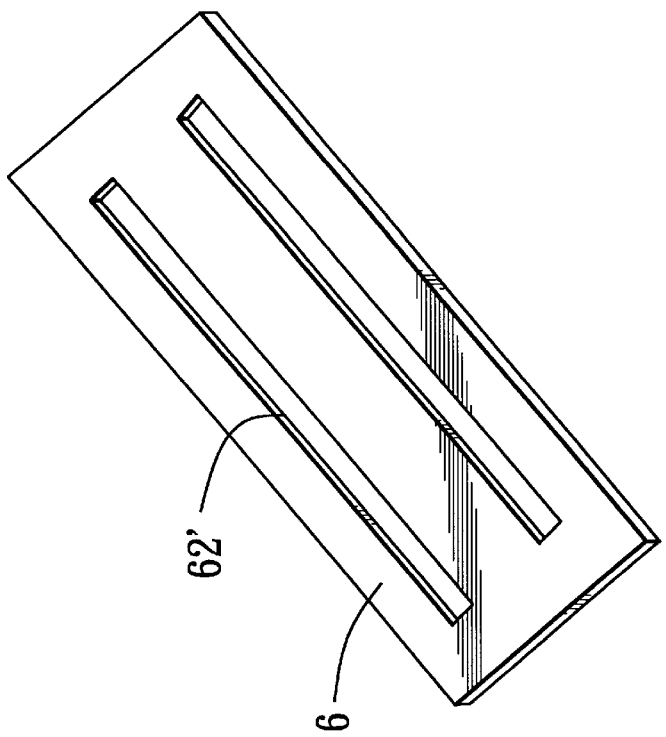
FIG. 8 is a perspective view showing a modification of the adhesive layer of FIG. 7.

Like the first adhesive layer 4, the windows 62 of the second adhesive layer 6 along a longitudinal axis can be replaced by an elongate slot 62', as shown in FIG. 8.

A metal heat dissipating plate 33 is mounted on the side 32 of each of the second semiconductor chips 3 opposite to the contact pad surface 30. An encapsulation layer 34 is formed around each of the second semiconductor chips 3 inside the corresponding chip-receiving opening 11 of the substrate 1. As described above, the encapsulation layers 34 can be made of, for example, an epoxy resin.

It is noted that the first and second semiconductor chips 2 and 3 have different functions. For example, the first semiconductor chip 2 can be a central processing unit (CPU), whereas the second semiconductor chips 3 can be memory units.

Moreover, conductive traces similar to those shown in FIG. 2 can be patterned on the second surface 14 of the substrate 1 and electrically connected to the conductive vias 15. Hence, other electrical devices (not shown) can be mounted onto the second surface 14 of the substrate 1.

Figure 9:
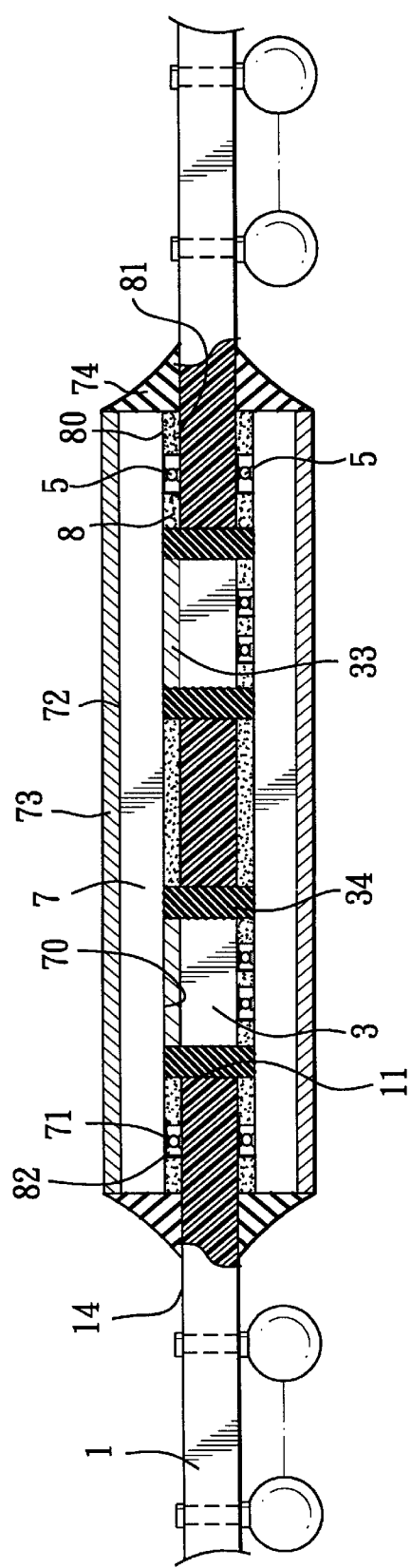
FIG. 9 is a schematic partly cross-sectional view of a multi-chip semiconductor module in accordance with a second preferred embodiment of the present invention.

FIG. 9 is a schematic partly cross-sectional view of a multi-chip semiconductor module in accordance with a second preferred embodiment of the present invention.

Unlike the first preferred embodiment, the multi-chip semiconductor module of the present embodiment further includes a third semiconductor chip 7. The third semiconductor chip 7 has a contact pad surface 70 on which a plurality of contact pads 71 are disposed, and a side 72 opposite to the contact pad surface 70. The second surface 14 of the substrate 1 is further patterned with a second circuit layout that is similar to the first circuit layout 12 and that is connected electrically to the conductive vias 15.

A third adhesive layer 8 has a first adhesive surface 81 adhered to the second surface 14 of the substrate 1, and a second adhesive surface 80 adhered to the contact pad surface 70 of the third semiconductor chip 7. Since the structure of the third adhesive layer 8 is similar to that of the first adhesive layer 4, a detailed description thereof is thus omitted herein. A plurality of conductive bodies 5 are disposed respectively in the windows 82 of the third adhesive layer 8 and connect electrically the contact pads 71 of the third semiconductor chip 7 and the second circuit layout. A metal heat dissipating plate 73 is mounted on the side 72 of the third semiconductor chip 7. Contactless portions of the contact pad surface 70 of the third semiconductor chip 7 corresponding to the chip-receiving openings 11 of the substrate 1 abut against the metal heat dissipating plates 33 of the second semiconductor chips 3. An encapsulation layer 74 is formed around the third semiconductor chip 7 for protection purposes. As described above, the encapsulation layer 74 can be made of an epoxy resin. Alternatively, the encapsulation layer 74 can be made of a metal material. If the encapsulation layer 74 is made of metal, the encapsulation layers 34 for the second semiconductor chips 3 can be omitted.

Figure 10:
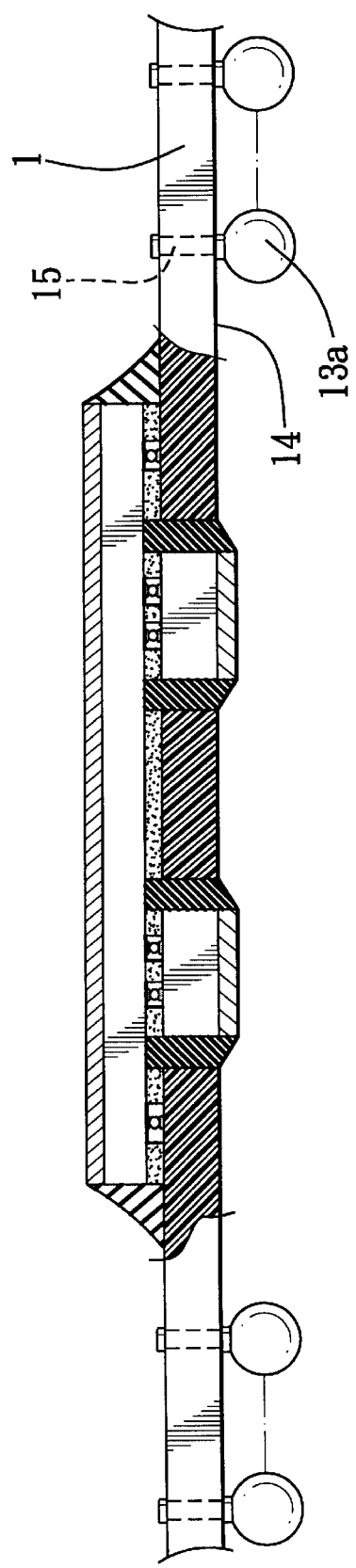
FIG. 10 is a schematic partly cross-sectional view of a multi-chip semiconductor module in accordance with a third preferred embodiment of the present invention.

Reference is now made to FIG. 10, which is a schematic partly cross-sectional view of a multi-chip semiconductor module in accordance with a third preferred embodiment of the present invention. Unlike the first preferred embodiment, the solder balls 13a are mounted on the second surface 14 of the substrate 1 at positions corresponding to the conductive vias 15, and are connected electrically and respectively to the conductive vias 15.

Figure 11:
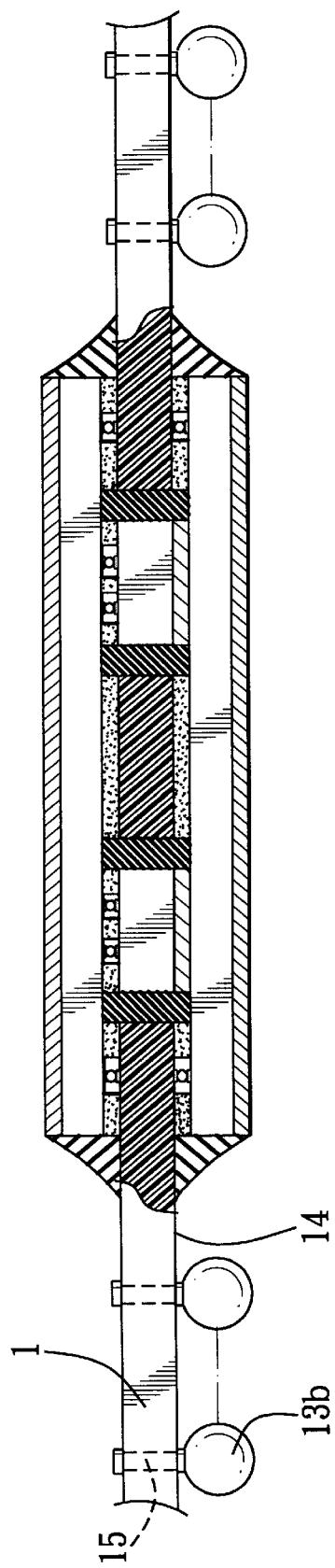
FIG. 11 is a schematic partly cross-sectional view of a multi-chip semiconductor module in accordance with a fourth preferred embodiment of the present invention.

FIG. 11 is a schematic partly cross-sectional view of a multi-chip semiconductor module in accordance with a fourth preferred embodiment of the present invention. Unlike the second preferred embodiment, the solder balls 13b are mounted on the second surface 14 of the substrate 1 at positions corresponding to the conductive vias 15, and are connected electrically and respectively to the conductive vias 15.

While the present invention has been disclosed with reference to the preferred embodiments described above, it is not intended to limit the present invention in any way. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A process of manufacturing a multi-chip semiconductor module, comprising the steps of:

(a) providing a substrate having opposite first and second surfaces, a plurality of conductive vias that extend through said first and second surfaces, a first circuit layout patterned on said first surface of said substrate and connected electrically to said conductive vias, and a chip-receiving opening formed therein;

(b) mounting a contact pad surface of a first semiconductor chip on said first surface of said substrate such that said first semiconductor chip has a first set of contact pads registered with said chip-receiving opening, and a second set of contact pads around said chip-receiving opening, and connecting electrically said second set of contact pads of said first semiconductor chip to said first circuit layout;

(c) disposing an adhesive layer having opposite first and second adhesive surfaces and a plurality of windows that extend through said first and second adhesive surfaces inside said chip-receiving opening, and adhering said second adhesive surface of said adhesive layer to said contact pad surface of said first semiconductor chip such that said windows are registered with said first set of contact pads of said first semiconductor chip;

(d) placing a first conductive body in each of said windows; and (e) disposing a second semiconductor chip in said chip-receiving opening, and attaching a contact pad surface of said second semiconductor chip to said first adhesive surface of said adhesive layer so that a plurality of contact pads on said contact pad surface of said second semiconductor chip are connected electrically and respectively with said first conductive bodies in said windows to establish electrical connection with said first semiconductor chip.

2. The process of claim 1, further comprising the step of mounting a plurality of solder balls on one of said first and second surfaces of said substrate at positions corresponding to said conductive vias such that said solder balls are connected electrically and respectively to said conductive vias.

3. The process of claim 1, wherein said second surface of said substrate is patterned with a second circuit layout that is connected electrically to said conductive vias, said process further comprising the step of mounting a contact pad surface of a third semiconductor chip on said second surface of said substrate, and connecting electrically a plurality of contact pads on said contact pad surface of said third semiconductor chip to said second circuit layout.

4. The process of claim 1, further comprising the step of:
(f) mounting a metal heat dissipating plate on one side of said second semiconductor chip opposite to said contact pad surface thereof.

5. The process of claim 4, wherein said second surface of said substrate is patterned with a second circuit layout that is connected electrically to said conductive vias, said process further comprising the step of:
(g) mounting a contact pad surface of a third semiconductor chip on said second surface of said substrate such that said first, second and third semiconductor chips are disposed on a common vertical axis and such that a contactless portion of said contact pad surface of said third semiconductor chip abuts against said heat dissipating plate on said second semiconductor chip, and connecting electrically a plurality of contact pads on said contact pad surface of said third semiconductor chip to said second circuit layout.

6. The process of claim 5, wherein:
said step (b) includes the sub-steps of:
providing a second adhesive layer having opposite first and second adhesive surfaces and a plurality of second windows that extend through said first and second adhesive surfaces of said second adhesive layer,
adhering said first adhesive surface of said second adhesive layer to said first surface of said substrate such that said second windows permit access to said first circuit layout from said second adhesive surface of said second adhesive layer,
placing a second conductive body in each of said second windows, and
attaching said contact pad surface of said first semiconductor chip on said second adhesive surface of said second adhesive layer, with said second set of contact pads of said first semiconductor chip connecting electrically and respectively with said second conductive bodies in said second windows to establish electrical connection with said first circuit layout; and
wherein said step (h) includes the sub-steps of:
providing a third adhesive layer having opposite first and second adhesive surfaces and a plurality of third windows that extend through said first and second adhesive surfaces of said third adhesive layer,
adhering said first adhesive surface of said third adhesive layer to said second surface of said substrate such that said third windows permit access to said second circuit layout from said second adhesive surface of said third adhesive layer,
placing a third conductive body in each of said third windows, and
attaching said contact pad surface of said third semiconductor chip on said second adhesive surface of said third adhesive layer, with said contact pads of said third semiconductor chip connecting electrically and respectively with said third conductive bodies in said third windows to establish electrical connection with said second circuit layout.

7. The process of claim 3, further comprising the step of forming an encapsulation layer around at least one of said first, second and third semiconductor chips.

8. The process of claim 3, further comprising the step of mounting a heat dissipating plate on one side of at least one of said first, second and third semiconductor chips opposite to said contact pad surface thereof.

9. A process of manufacturing a multi-chip semiconductor module, comprising the steps of:
(a) providing a substrate having opposite first and second surfaces, a plurality of conductive vias that extend through said first and second surfaces, first and second circuit layouts patterned respectively on said first and second surfaces of said substrate and connected electrically to said conductive vias, and a chip-receiving opening formed therein;
(b) mounting a contact pad surface of a first semiconductor chip on said first surface of said substrate such that said first semiconductor chip has a first set of contact pads registered with said chip-receiving opening, and a second set of contact pads around said chip-receiving opening, and connecting electrically said second set of contact pads of said first semiconductor chip to said first circuit layout;
(c) disposing a second semiconductor chip in said chip-receiving opening, mounting a contact pad surface of said second semiconductor chip to said contact pad surface of said first semiconductor chip, and connecting electrically a plurality of contact pads on said contact pad surface of said second semiconductor chip with said first set of contact pads of said first semiconductor chip; and
(d) mounting a contact pad surface of a third semiconductor chip on said second surface of said substrate, and connecting electrically a plurality of contact pads on said contact pad surface of said third semiconductor chip to said second circuit layout.

10. The process of claim 9, further comprising the step of mounting a plurality of solder balls on one of said first and second surfaces of said substrate at positions corresponding to said conductive vias such that said solder balls are connected electrically and respectively to said conductive vias.

11. The process of claim 9, further comprising, prior to said step (d), the step of forming an encapsulation layer around said second semiconductor chip inside said chip-receiving opening.

12. The process of claim 9, further comprising, prior to said step (d), the step of mounting a metal heat dissipating plate on one side of said second semiconductor chip opposite to said contact pad surface thereof.

13. The process of claim 12, wherein in said step (d), said first, second and third semiconductor chips are disposed on a common vertical axis, and said contact pad surface of said third semiconductor chip has a contactless portion that abuts against said heat dissipating plate on said second semiconductor chip.

14. The process of claim 9, further comprising the step of forming an encapsulation layer around at least one of said first, second and third semiconductor chips.

15. The process of claim 9, further comprising the step of mounting a heat dissipating plate on one side of at least one of said first, second and third semiconductor chips opposite to said contact pad surface thereof.

16. A multi-chip semiconductor module, comprising:
   a substrate having opposite first and second surfaces, a plurality of conductive vias that extend through said first and second surfaces, a first circuit layout patterned on said first surface of said substrate and connected electrically to said conductive vias, and a chip-receiving opening formed therein;
   a first semiconductor chip having a contact pad surface on which first and second sets of contact pads are disposed;
   a first adhesive layer having a first adhesive surface adhered to said first surface of said substrate and a second adhesive surface adhered to said contact pad surface of said first semiconductor chip such that said first set of contact pads is registered with said chip-receiving opening, and such that said second set of contact pads is disposed around said chip-receiving opening, said first adhesive layer being formed with a plurality of windows that extend through said first and second adhesive surfaces and that are registered with said second set of contact pads;
   a plurality of conductive bodies disposed respectively in said windows of said first adhesive layer and connecting electrically said second set of contact pads and said first circuit layout;
   a second adhesive layer disposed inside said chip-receiving opening and having opposite first and second adhesive surfaces and a plurality of windows that extend through said first and second adhesive surfaces of said second adhesive layer, said second adhesive surface of said second adhesive layer being adhered to said contact pad surface of said first semiconductor chip such that said windows of said second adhesive layer are registered with said first set of contact pads of said first semiconductor chip;
   a plurality of conductive bodies disposed respectively in said windows of said second adhesive layer and connected electrically to said first set of contact pads; and
   a second semiconductor chip disposed in said chip-receiving opening and having a contact pad surface attached to said first adhesive surface of said second adhesive layer, said contact pad surface of said second semiconductor chip having a plurality of contact pads that are connected electrically and respectively with said conductive bodies in said windows of said second adhesive layer to establish electrical connection with said first semiconductor chip.

17. The multi-chip semiconductor module of claim 16, further comprising a plurality of solder balls mounted on one of said first and second surfaces of said substrate at positions corresponding to said conductive vias and connected electrically and respectively to said conductive vias.

18. The multi-chip semiconductor module of claim 16, wherein said second surface of said substrate is patterned with a second circuit layout that is connected electrically to said conductive vias, said multi-chip semiconductor module further comprising:
   a third semiconductor chip having a contact pad surface on which a plurality of contact pads are disposed;
   a third adhesive layer having a first adhesive surface adhered to said second surface of said substrate and a second adhesive surface adhered to said contact pad surface of said third semiconductor chip, said third adhesive layer being formed with a plurality of windows that extend through said first and second adhesive surfaces of said third adhesive layer and that are registered with said contact pads of said third semiconductor chip; and
   a plurality of conductive bodies disposed respectively in said windows of said third adhesive layer and connecting electrically said contact pads of said third semiconductor chip and said second circuit layout.

19. The multi-chip semiconductor module of claim 18, further comprising an encapsulation layer formed around at least one of said first, second and third semiconductor chips.

20. The multi-chip semiconductor module of claim 18, further comprising a metal heat dissipating plate mounted on one side of at least one of said first, second and third semiconductor chips opposite to said contact pad surface thereof.

21. A multi-chip semiconductor module, comprising:
   a substrate having opposite first and second surfaces, a plurality of conductive vias that extend through said first and second surfaces, first and second circuit layouts patterned respectively on said first and second surfaces of said substrate and connected electrically to said conductive vias, and a chip-receiving opening formed therein;
   a first semiconductor chip having a contact pad surface on which first and second sets of contact pads are disposed, said contact pad surface of said first semiconductor chip being mounted on said first surface of said substrate such that said first set of contact pads are registered with said chip-receiving opening, and such that said second set of contact pads are disposed around said chip-receiving opening and are connected electrically to said first circuit layout;
   a second semiconductor chip disposed in said chip-receiving opening, and having a contact pad surface on which a plurality of contact pads are disposed, said contact pad surface of said second semiconductor chip being mounted to said contact pad surface of said first semiconductor chip such that said contact pads of said second semiconductor chip are connected electrically to said first set of contact pads of said first semiconductor chip; and
   a third semiconductor chip having a contact pad surface on which a plurality of contact pads are disposed, said contact pad surface of said third semiconductor chip being mounted on said second surface of said substrate such that said contact pads of said third semiconductor chip are connected electrically to said second circuit layout.

22. The multi-chip semiconductor module of claim 21, further comprising a plurality of solder balls mounted on one of said first and second surfaces of said substrate at positions corresponding to said conductive vias and connected electrically and respectively to said conductive vias.

23. The multi-chip semiconductor module of claim 21, further comprising a metal heat dissipating plate mounted on one side of said second semiconductor chip opposite to said contact pad surfaces thereof.

24. The multi-chip semiconductor module of claim 23, wherein said first, second and third semiconductor chips are disposed on a common vertical axis, and said contact pad surface of said third semiconductor chip has a contactless portion that abuts against said heat dissipating plate on said second semiconductor chip.

25. The multi-chip semiconductor module of claim 21, further comprising an encapsulation layer formed around at least one of said first, second and third semiconductor chips.

26. The multi-chip semiconductor module of claim 21, further comprising a metal heat dissipating plate mounted on one side of at least one of said first, second and third semiconductor chips opposite to said contact pad surface thereof.

* * * * *